United States Patent
Kinugasa et al.

(10) Patent No.: US 7,262,646 B2
(45) Date of Patent: Aug. 28, 2007

(54) POWER-ON RESET CIRCUIT

(75) Inventors: Norihide Kinugasa, Joyo (JP); Yoshio Nirasawa, Muko (JP); Hideo Hamaguchi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 85 days.

(21) Appl. No.: 10/891,230

(22) Filed: Jul. 15, 2004

(65) Prior Publication Data

US 2005/0012531 A1   Jan. 20, 2005

(30) Foreign Application Priority Data

Jul. 16, 2003   (JP) .............. 2003-275667

(51) Int. Cl.
*H03L 7/00* (2006.01)
(52) U.S. Cl. .................................. 327/143
(58) Field of Classification Search ............... 327/143, 327/198, 142
See application file for complete search history.

(56) References Cited

U.S. PATENT DOCUMENTS

| | | | | |
|---|---|---|---|---|
| 4,551,841 A | * | 11/1985 | Fujita et al. .................. 714/22 |
| 5,144,159 A | * | 9/1992 | Frisch et al. ................. 327/198 |
| 5,552,725 A | * | 9/1996 | Ray et al. .................... 327/143 |
| 5,898,327 A | * | 4/1999 | Tanaka ........................ 327/143 |
| 6,147,521 A | * | 11/2000 | Degoirat et al. .............. 327/81 |
| 6,160,428 A | * | 12/2000 | Pasqualini ................... 327/142 |
| 6,597,215 B2 | * | 7/2003 | Wang ........................... 327/143 |

FOREIGN PATENT DOCUMENTS

| | | |
|---|---|---|
| JP | 53-106524 A | 9/1978 |
| JP | 57-183125 A | 11/1982 |
| JP | 61-26326 A | 2/1986 |
| JP | 7-15308 A | 1/1995 |

* cited by examiner

*Primary Examiner*—Quan Tra
(74) *Attorney, Agent, or Firm*—McDermott Will & Emery LLP

(57) ABSTRACT

A power-on reset circuit of the present invention comprises: a first p-channel MOS transistor having the gate and the drain which are grounded and having a substrate which is connected to a power supply; a first resistor which is inserted and connected between the above-mentioned power supply and the source of the above-mentioned first p-channel MOS transistor; a first inverter having an input terminal which is connected to the source of the first p-channel MOS transistor; and a power-on reset signal output terminal which is connected to an output terminal of the first inverter.

8 Claims, 11 Drawing Sheets

(a)

(b)

(a)

(b)

(a)

(b)

POWER-ON RESET CIRCUIT

TECHNICAL FIELD

The present invention relates to a power-on reset circuit.

A power-on reset circuit is incorporated on a digital system having a need to reset the system and initialize data immediately after power is turned on.

The power-on reset circuit of the conventional art will be described with reference to FIG. 9, FIG. 10 and FIG. 11. The power-on reset circuit of the conventional art is shown in FIG. 9. In the power-on reset circuit of the conventional art, a resistor 30 and a capacitor 10 are series-connected between a power supply potential VDD and a ground potential VSS. An input terminal of an inverter 40 is connected to a connecting point Na between the resistor 30 and the capacitor 10. The two input terminals of an AND circuit 20 are connected to an output terminal of the inverter 40 and the power supply potential VDD, respectively, and an output terminal of the AND circuit 20 is connected to a power-on reset signal output terminal. The output terminal of the AND circuit 20 outputs a power-on reset signal PON. The power-on reset signal PON is active at H level (When the power-on reset signal PON is at H level and the power-on reset signal PON is impressed at the input of the external circuit, the external circuit is reset). The inverter 40 comprises a p-channel MOS transistor (not shown) and an n-channel MOS transistor (not shown). Threshold potential of the inverter 40 is assumed as high as half level of the power supply potential VDD.

FIG. 10 is a voltage waveform chart showing the operation of the power-on reset circuit of the conventional art in a case where power supply rises relatively abruptly. Part (a) of FIG. 10 shows waveforms of the power supply potential VDD and the potential Va of the connecting point Na. $V_{GS}$ is a threshold voltage between the gate and the source of the p-channel MOS transistor that composes the inverter 40. Part (b) of FIG. 10 shows waveform of the power-on reset signal PON.

After power is turned on at time "0", the power supply potential VDD rises from zero and reaches maximum value Ve at time "te". The capacitor 10 is charged via the resistor 30, and the potential Va of the connecting point Na rises with delay from the rising of the power supply potential VDD. Time constant until the capacitor 10 is charged will be determined from the product of the capacity of the 30.

From time "0" till "t4", the output of the inverter 40 is at L level, since the potential difference between the gate potential Va and the source potential VDD (potential difference between the gate and the source (VDD-Va)) of the p-channel MOS transistor that composes the inverter 40 is smaller than a threshold voltage $V_{GS}$. Therefore, the output of the AND circuit 20 becomes an L level, and the power-on reset signal PON will not be outputted. From the time "t4" onward, the output of the inverter 40 becomes an H level, since voltage between the gate and the source (VDD-Va) of the p-channel MOS transistor that composes the inverter 40 exceeds the threshold voltage $V_{GS}$. Therefore, the two input terminals of the AND circuit 20 both become H levels, and the power-on reset signal PON will become an H level. At time "t5", the input potential (the potential Va of the connecting point Na) of the inverter 40 reaches as high as half level of the power supply potential VDD (VDD/2) (reaches a threshold potential). From the time "t5" onward, the power-on reset signal PON becomes an L level, since the output of the inverter 40 becomes an L level.

Parenthetically, the power-on reset circuit may be configured so as not to use the AND circuit 20, but to use the output signal of the inverter 40 as the power-on reset signal PON.

FIG. 11 is a voltage waveform chart showing the operation of the power-on reset circuit of the conventional art in a case where power supply rises gently. In FIG. 11, part (a) shows the waveforms of the power supply potential VDD and the potential Va of the connecting point Na. Part (b) shows the waveform of the power-on reset signal PON. Time "te" until the power supply potential VDD rises is extremely long in comparison with part (a) of FIG. 10, and the time constant until the capacitor 10 is charged is approximately the same as the time until power supply rises. The potential Va of the connecting point Na rises along with the power supply potential VDD. Therefore, voltage between the gate and the source (VDD-Va) of the p-channel MOS transistor that composes the inverter 40 does not exceed the threshold voltage $V_{GS}$, and the power-on reset signal PON is constantly at L level.

Furthermore, the power-on reset circuit of the conventional art has a problem in which square measure of the entire LSI cannot be minified since the capacitor 10 is included.

The power-on reset circuit disclosed in Official Gazette of Japanese Unexamined Patent Publication No. Hei 7-15308 uses a flip-flop, and is capable of stably making the power-on reset signal active even when power supply voltage rises gently. However, since the flip-flop occupies a large area in the LSI, the use of the flip-flop was a drawback in the integration of the power-on reset circuit. And there has been a problem of dispensing with the flip-flop.

BRIEF SUMMARY OF THE INVENTION

The present invention provides a solution to the problem of the above-mentioned conventional art, and aims to provide a power-on reset circuit in which a power-on reset signal surely becomes active, regardless of the rise time of power supply voltage.

The present invention aims to provide a power-on reset circuit in which power-on reset signal surely becomes active regardless of the rise time of power supply voltage, and which can be well-integrated.

In order to solve the above-mentioned problems, the present invention has the following configuration. A power-on reset circuit in accordance with the present invention from one aspect comprises: a first p-channel MOS transistor having the gate and the drain which are grounded and having a substrate which is connected to a power supply; a first resistor which is inserted and connected between the above-mentioned power supply and the source of the above-mentioned first p-channel MOS transistor; a first inverter having an input terminal which is connected to the source of the above-mentioned first p-channel MOS transistor; and a power-on reset signal output terminal which is connected to an output terminal of the above-mentioned first inverter.

The potential of the input terminal of the first inverter reaches the threshold voltage of the first p-channel MOS transistor and becomes constant, before power supply potential completely rises. Thereupon, the potential of the input terminal of the first inverter exceeds the threshold potential of the first inverter, and the first inverter outputs a signal having L level. Thereafter, the power supply potential further rises and, when the potential of the input terminal of the first inverter which has become constant falls below the threshold potential of the first inverter, the output of the first inverter changes from L level to H level. Therefore, output of the first inverter can be used as a power-on reset signal regardless of the rise time of the power supply potential.

The power-on reset circuit of the present invention can be well-integrated as a whole circuit, since the present invention does not use a capacitor.

A power-on reset circuit in accordance with the present invention from one aspect comprises: a first p-channel MOS transistor having the gate and the drain which are grounded and having a substrate which is connected to a power supply; a second p-channel MOS transistor having the gate, the source and a substrate which are connected to the above-mentioned power supply and having the drain which is connected to the source of the above-mentioned first p-channel MOS transistor; a first inverter having an input terminal which is connected to the source of the above-mentioned first p-channel MOS transistor; and a power-on reset signal output terminal which is connected to an output terminal of the above-mentioned first inverter.

Since the circuit of the present invention is composed of transistors only, the power-on reset circuit that is inexpensive and is well-integrated can be provided.

The above-mentioned power-on reset circuit in accordance with the present invention from another aspect further comprises a third p-channel MOS transistor having the drain which is grounded, having the gate which is connected to the above-mentioned power supply, and having a substrate and the source which are connected to the input terminal of the above-mentioned first inverter.

The power-on reset circuit of the present invention can surely generate a power-on reset signal even when the power supply is restarted after instantaneous power interruption.

The above-mentioned power-on reset circuit in accordance with the present invention from another aspect further comprises a first n-channel MOS transistor having the gate, the drain and a substrate which are grounded and having the source which is connected to the input terminal of the above-mentioned first inverter.

The power-on reset circuit of the present invention can surely generate a power-on reset signal even when the power supply is restarted after instantaneous power interruption.

In the above-mentioned power-on reset circuit in accordance with the present invention from another aspect, a pulse generating circuit for generating a pulse having a predetermined time width is inserted between the output terminal of the above-mentioned first inverter and the above-mentioned power-on reset signal output terminal.

The power-on reset circuit of the present invention comprises the pulse generating circuit for setting the time width of the power-on reset signal to the predetermined width. Therefore, by appropriately setting the time width of the power-on reset signal, the power-on reset circuit can surely reset the LSI even in a case where the power-on reset circuit is connected to an LSI in which the permissible range of operating power supply voltage is restricted, or to an LSI in which the minimum value of time width of power-on reset signal is defined.

In regard to the above-mentioned power-on reset circuit in accordance with the present invention from another aspect, the above-mentioned pulse generating circuit comprises: a second inverter having an input terminal which is connected to the output terminal of the above-mentioned first inverter; a second n-channel MOS transistor having the gate which is connected to an output terminal of the above-mentioned second inverter, and having the source and a substrate which are grounded; a capacitor which is connected between the drain of the above-mentioned second n-channel MOS transistor and the ground potential; a second resistor which is connected between the above-mentioned power supply and the drain of the above-mentioned second n-channel MOS transistor; and a NAND circuit having two input terminals which are connected to the drain of the above-mentioned second n-channel MOS transistor and the output terminal of the above-mentioned first inverter, respectively, and having an output terminal which is connected to the above-mentioned power-on reset signal output terminal.

The power-on reset circuit of the present invention can set the time width of a power-on reset signal according to the capacity of the capacitor and/or the resistance value of the second resistor composing the pulse generating circuit.

The above-mentioned power-on reset circuit in accordance with the present invention from another aspect further comprises a NAND circuit which is inserted between the output terminal of the above-mentioned first inverter and the above-mentioned power-on reset signal output terminal, has two input terminals connected to the above-mentioned power supply and the output terminal of the above-mentioned first inverter, respectively, and has an output terminal connected to the above-mentioned power-on reset signal output terminal.

The power-on reset circuit of the present invention generates a power-on reset signal when power supply potential reaches the threshold potential of the first p-channel MOS transistor for the first time, and later stops the generation of the power-on reset signal when the power supply potential further rises and the potential of the input terminal of the first inverter which became constant falls below the threshold potential of the first inverter.

The power-on reset circuit of the present invention works to be capable of surely generating a power-on reset signal regardless of the rise time of power supply potential.

According to the present invention, an advantageous effect capable of realizing a power-on reset circuit which surely generates a power-on reset signal regardless of the rise time of power supply voltage, can be obtained.

According to the present invention, an advantageous effect capable of realizing a power-on reset circuit which surely generates a power-on reset signal regardless of variety of the rise time of power supply voltage, and which can be integrated into an IC, can be obtained.

While the novel features of the invention are set forth particularly in the appended claims, the invention, both as to organization and content, will be better understood and appreciated, along with other objects and features thereof, from the following detailed description taken in conjunction with the drawings.

Part or all of the drawings are drawn schematically for diagrammatic representation and it should be considered that they do not necessarily reflect relative size and position of components shown therein.

DETAILED DESCRIPTION OF THE INVENTION

Embodiments that specifically show the best mode for conducting the present invention will be described below with reference to figures.

<<First Embodiment>>

Figure 1:
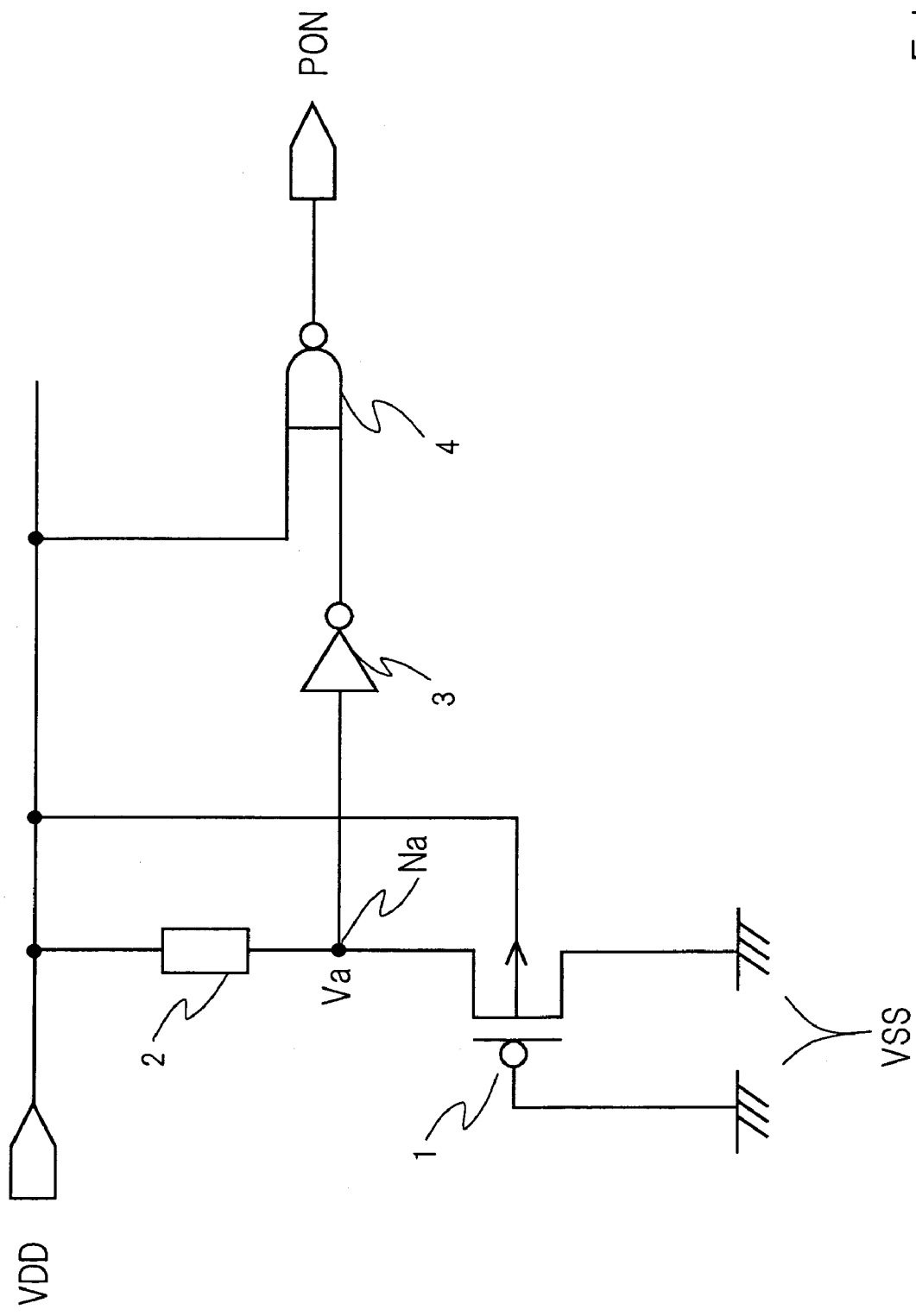
FIG. 1 is a circuit diagram of a power-on reset circuit in accordance with the first embodiment of the present invention.

The power-on reset circuit in accordance with the first embodiment of the present invention will be described with reference to FIG. 1, FIG. 3 and FIG. 4. FIG. 1 is a circuit diagram of a power-on reset circuit in accordance with the first embodiment of the present invention.

The power-on reset circuit in accordance with the first embodiment is comprised of a first p-channel MOS transistor 1, a first resistor 2, a first inverter 3 and a NAND circuit 4. The first resistor 2 and the first p-channel MOS transistor 1 is connected in series between a power supply potential VDD and a ground potential VSS. The gate and the drain of the first p-channel MOS transistor 1 are connected to a ground potential VSS, and a substrate is connected to the power supply potential VDD. "Na" is a connecting point of the first resistor 2 with the source of the first p-channel MOS transistor 1.

The source of the first p-channel MOS transistor 1 is connected to the input terminal of the first inverter 3. The power supply potential VDD and the output terminal of the first inverter 3 are connected to the two input terminals of the NAND circuit 4 respectively, and the output terminal of NAND circuit 4 is connected to a power-on reset signal output terminal. The output terminal of the NAND circuit 4 outputs a power-on reset signal PON. The power-on reset signal PON is active at H level (When the power-on reset signal PON is at H level and the power-on reset signal PON is impressed at the input of the external circuit, the external circuit is reset). The first inverter 3 is comprised of a p-channel MOS transistor (not shown) and a n-channel MOS transistor (not shown). The threshold potential of the first inverter 3 is assumed as high as half level of power supply potential VDD.

Figure 3:
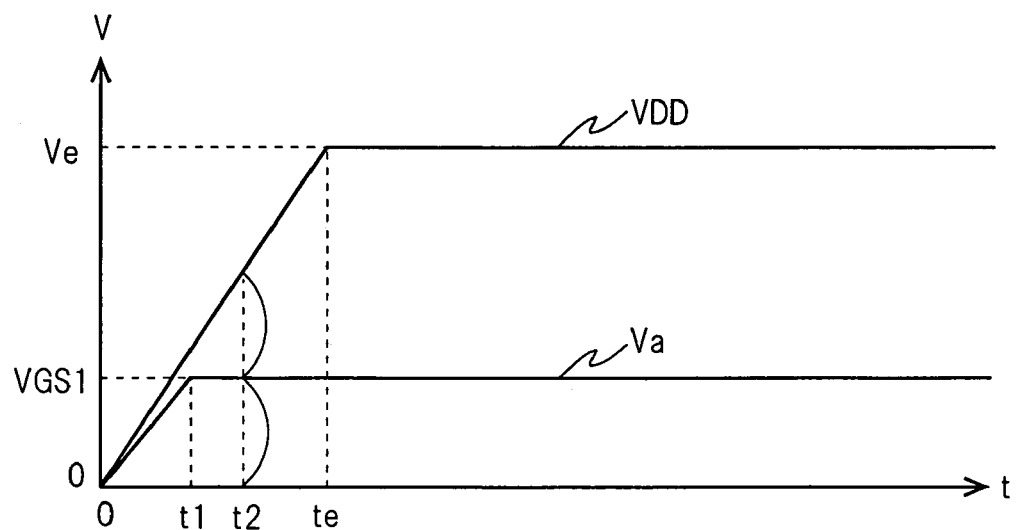
FIG. 3 is a voltage waveform chart showing the operation of a power-on reset circuit in accordance with the first embodiment and the second embodiment of the present invention in the case where power supply rises relatively abruptly, wherein part (a) of FIG. 3 shows waveforms of the power supply potential VDD and the potential Va of the connecting point Na, and part (b) of FIG. 3 shows a waveform of the power-on reset signal PON.
Figure 3:
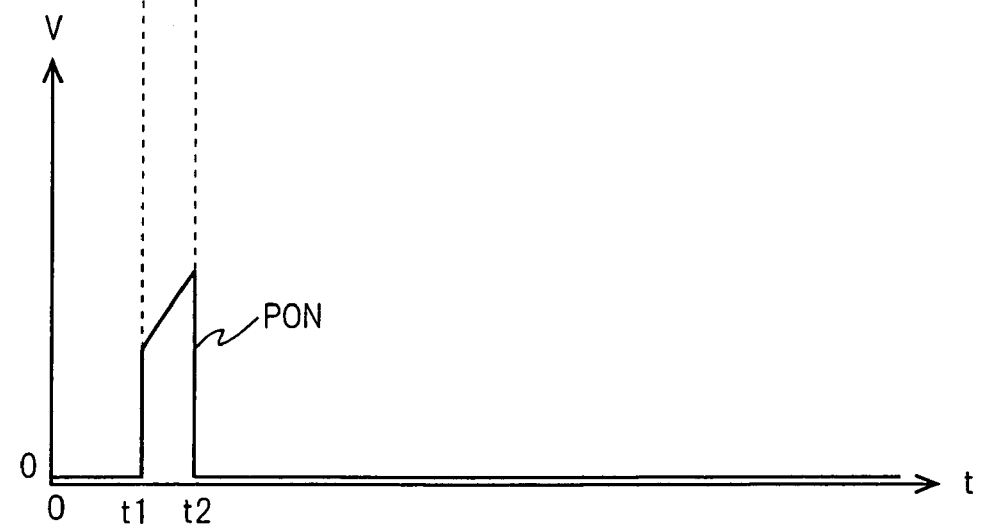

FIG. 3 is a voltage waveform chart showing the operation of the power-on reset circuit in accordance with the first embodiment of the present invention in the case where power supply rises relatively abruptly. Part (a) of FIG. 3 shows the waveforms of the power supply potential VDD and the potential Va of the connecting point Na. "$V_{GS1}$" designates the threshold potential of the first p-channel MOS transistor. Part (b) of FIG. 3 shows a waveform of the power-on reset signal PON. After the power is turned on at time "0", the power supply potential VDD rises from zero and reaches the maximum value "Ve" at time "te".

After power is turned on at the time "0", the potential Va of the connecting point Na rises along with the power supply potential VDD due to microcurrent that flows through the first resistor 2. As a result, the potential difference Va between the gate and the source of the first p-channel MOS transistor reaches the threshold voltage $V_{GS1}$ at time "t1", and the first p-channel MOS transistor is electrically conducted. The potential Va of the connecting point Na becomes a constant value thereafter. From the time "t1" onward, the first inverter 3 and the NAND circuit 4 operate according to the logic input. Output of the first inverter 3 from the power-on to the time "t1" will be at L level. On the other hand, the power supply potential VDD which is connected to an n-channel MOS transistor (not shown) or a p-channel MOS transistor (not shown) which composes the NAND circuit 4 does not reach the threshold potential of each transistor. Therefore, the power-on reset signal PON outputted from the NAND circuit 4 remains at L level until the time "t1".

From the time "t1" onward, all the circuits in FIG. 1 operate. The time when the power supply potential VDD reaches a twofold value (2Va) of the potential Va of the connecting point Na is assumed as time "t2". At the time "t2", the power supply potential VDD is still on the rise. From the time "t1" to the time "t2", the output of the first inverter 3 is at L level, since input voltage Va of the first inverter 3 satisfies the relational expression Va>VDD/2. Therefore, power-on reset signal PON which is an output of the NAND circuit 4 becomes an H level (the power-on reset signal PON becomes active). From the time "t2" onward, the output of the first inverter 3 is at H level, since the input voltage Va of the first inverter 3 satisfies the relational expression Va<VDD/2. Therefore, the power-on reset signal PON which is the output of the NAND circuit 4 becomes an L level (the power-on reset signal PON becomes inactive).

In short, the power-on reset signal PON becomes active during a period from the time "t1" to the time "t2", and thereafter becomes inactive.

Figure 4:
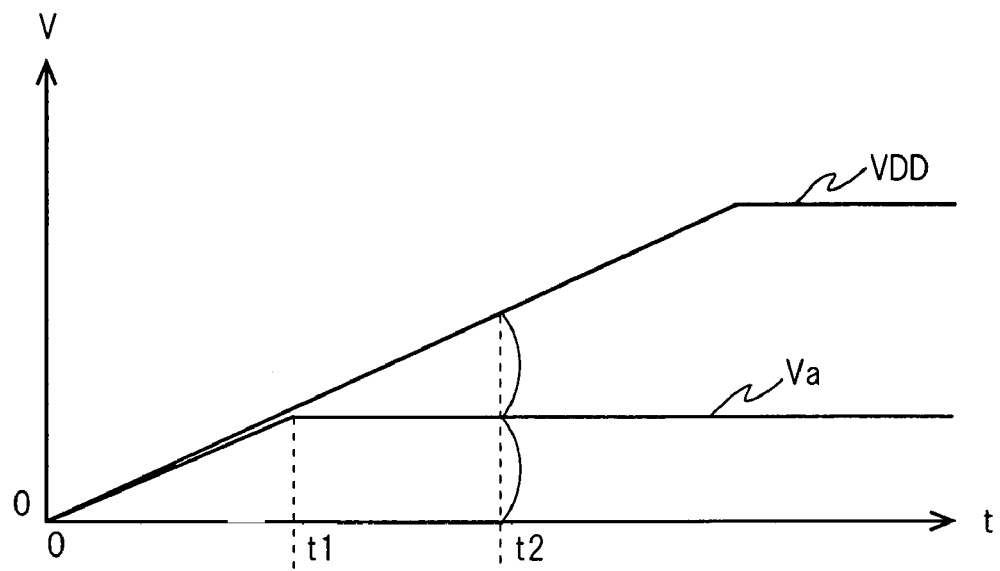
FIG. 4 is a voltage waveform chart showing the operation of a power-on reset circuit in accordance with the first embodiment and the second embodiment of the present invention in the case where power supply rises gently, wherein part (a) of FIG. 4 shows waveforms of the power supply potential VDD and the potential Va of the connecting point Na, and part (b) of FIG. 4 shows a waveform of the power-on reset signal PON.
Figure 4:
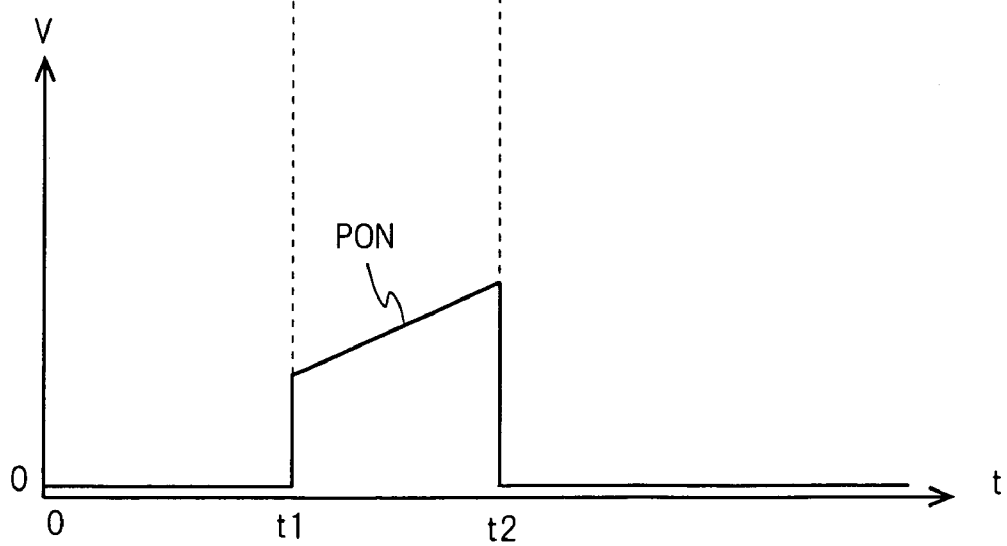

FIG. 4 is a voltage waveform chart showing the operation of the power-on reset circuit in accordance with the first embodiment of the present invention in the case where power supply rises gently. Part (a) of FIG. 4 shows the waveforms of the power supply potential VDD and the potential Va of the connecting point Na. Part (b) of FIG. 4 shows a waveform of the power-on reset signal PON. Even in the case where power supply rises gently, the power-on reset signal PON becomes active as is the case where the power supply rises abruptly (FIG. 3).

The power-on reset circuit in accordance with the first embodiment is configured so that the potential difference between the source and the drain of the first p-channel MOS transistor changes along with the power supply potential VDD. Therefore, regardless of the rise time of power supply potential, the power-on reset signal PON surely becomes active after the first inverter 3 and the NAND circuit 4 start operating according to their logical inputs (time "t1"), until the power supply potential VDD exceeds the twofold value of threshold potential $V_{GS1}$ of the first p-channel MOS transistor, that is until the relational expression Va<VDD/2 is satisfied (time "t2").

The time "t2" when source potential (the power supply potential VDD) of the p-channel MOS transistor of the first inverter 3 reaches the twofold value of the potential (threshold voltage of the first p-channel MOS transistor) of its input terminal (the time when the potential of the input terminal becomes equal to or less than the threshold potential) is definitely later than the time "t1" (when the circuit shown in FIG. 1 starts operating). Therefore, the power-on reset signal PON surely becomes inactive at the time "t2".

Since the power-on reset circuit in accordance with the first embodiment does not use a capacitor, the present invention can provide the power-on reset circuit that is inexpensive and is well-integrated.

<<Second Embodiment>>

Figure 2:
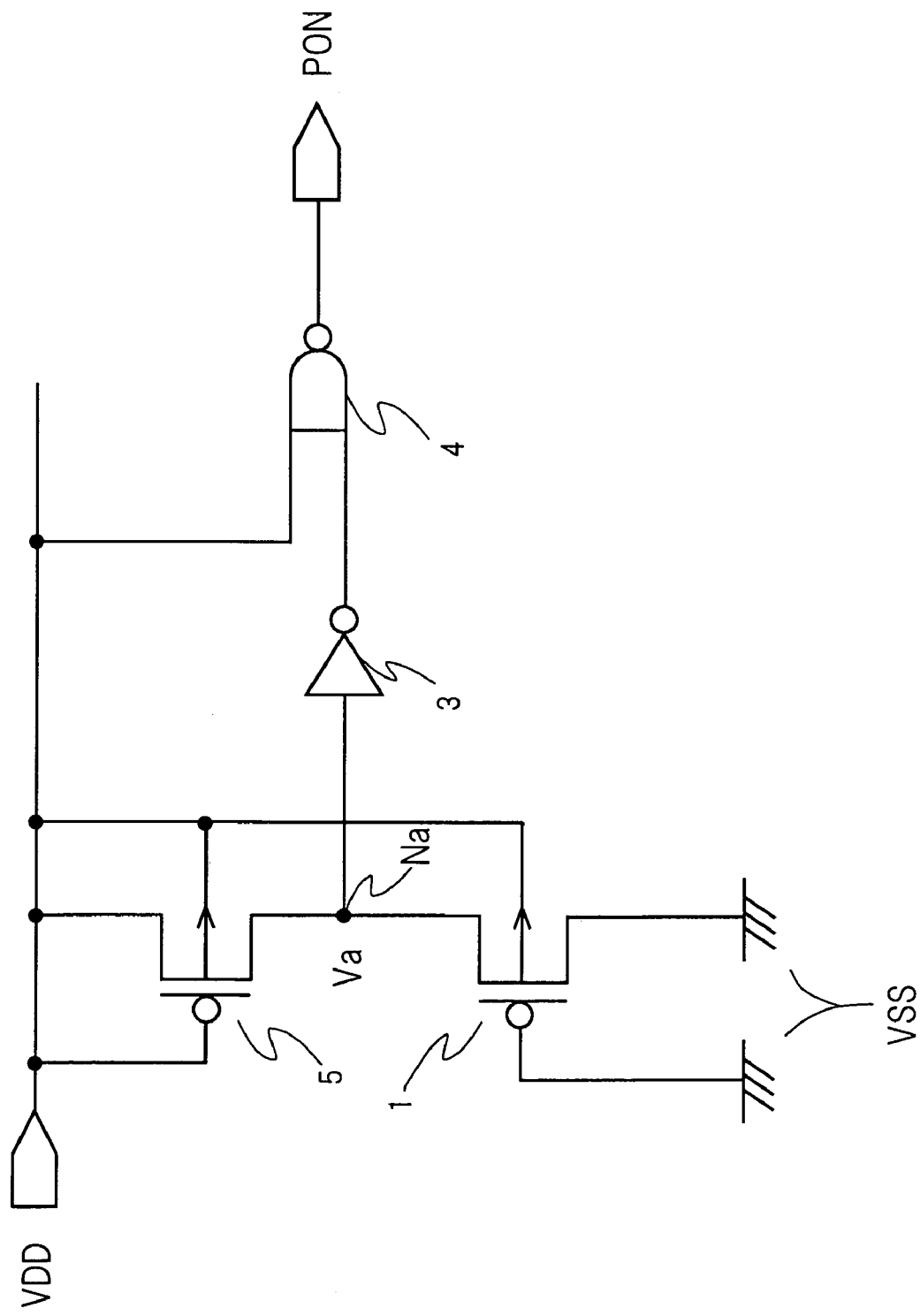
FIG. 2 is a circuit diagram of a power-on reset circuit in accordance with the second embodiment of the present invention.

FIG. 2 is a circuit diagram of a power-on reset circuit in accordance with the second embodiment of the present invention. The power-on reset circuit in accordance with the second embodiment replaces the first resistor 2 of the power-on reset circuit in accordance with the first embodiment with a second p-channel MOS transistor 5. The gate, the source and the substrate of the second p-channel MOS transistor 5 are connected to a power supply potential VDD, and the drain is connected to a connecting point Na. The second p-channel MOS transistor 5 works as high resistance element through the use of characteristics of its constant-current region.

Other configurations are same as those of the first embodiment, hence same reference numbers will be appended as an alternative to their description. The power-on reset circuit in accordance with the second embodiment operates similarly as the power-on reset circuit in accordance with the first embodiment (FIG. 1), and exerts the same effect. Furthermore, since the power-on reset circuit in accordance with the second embodiment is comprised of only transistors, the present invention can provide a power-on reset circuit that is inexpensive and is well-integrated.

<<Third Embodiment>>

Figure 5:
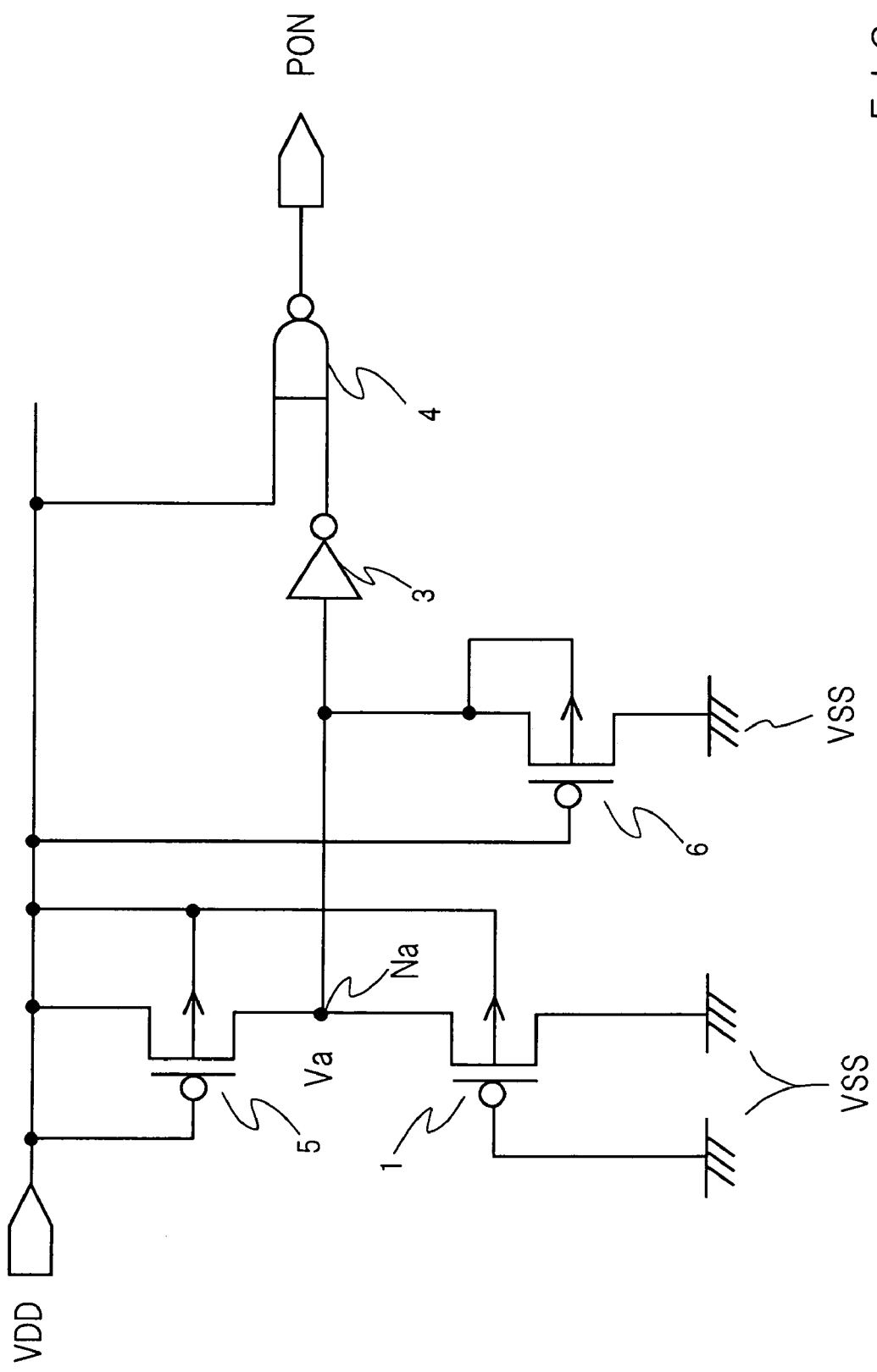
FIG. 5 is a circuit diagram of a power-on reset circuit in accordance with the third embodiment of the present invention.

FIG. 5 is a circuit diagram of a power-on reset circuit in accordance with the third embodiment of the present invention. The power-on reset circuit in accordance with the third embodiment further comprises a third p-channel MOS transistor 6 added to the power-on reset circuit in accordance with the second embodiment. In the third p-channel MOS transistor 6, the drain is connected to a ground potential VSS, the gate is connected to a power supply potential VDD, and the source and the substrate are connected to a connecting point Na. Other configurations are same as those of the second embodiment (FIG. 2), hence same reference numbers will be appended as an alternative to their description.

Operations in the case where the power supply potential VDD drops drastically from "Ve" to zero V and then recovers soon (instantaneous power interruption), after the power is turned on, the power-on reset signal PON becomes active and then later becomes inactive, will be described. In the power-on reset circuit in accordance with the second embodiment (FIG. 2), when the power supply potential VDD instantaneously becomes zero V, capacity coupling occurs between the first p-channel MOS transistor 1 and the second p-channel MOS transistor 5. Therefore, when the power supply potential drops drastically, potential Va of the connecting point Na drops drastically to ($V_{GS1}$–Ve). As a consequence, the potential Va does not recover to $V_{GS1}$, before the power supply potential VDD recovers to "Ve", thus having a possibility in which the power-on reset signal PON will not be generated normally.

In the power-on reset circuit in accordance with the third embodiment, when the power supply potential VDD drops drastically from "Ve" to zero V, the potential Va of the connecting point Na only drops to "–Vd" wherein pn junction voltage between the drain and the substrate of the third p-channel MOS transistor 6 is assumed as Vd. Therefore, the power-on reset signal PON can be generated normally even during the recovery of power supply potential.

<<Fourth Embodiment>>

Figure 6:
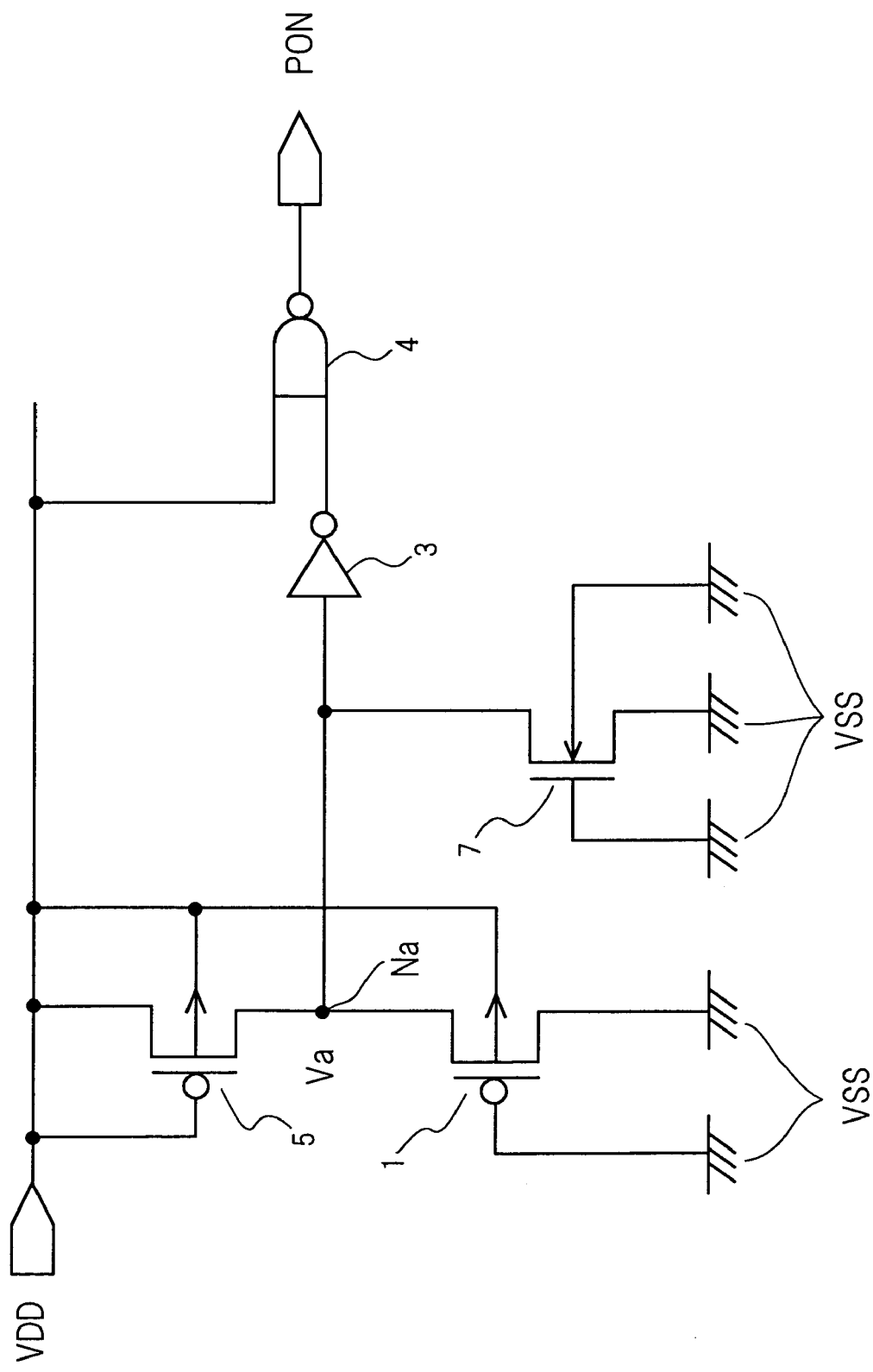
FIG. 6 is a circuit diagram of a power-on reset circuit in accordance with the fourth embodiment of the present invention.

FIG. 6 is a circuit diagram of a power-on reset circuit in accordance with the fourth embodiment of the present invention. The power-on reset circuit in accordance with the fourth embodiment further comprises a first n-channel MOS transistor 7 added to the power-on reset circuit in accordance with the second embodiment. In the first n-channel MOS transistor 7, the gate, the drain and a substrate are connected to a ground potential VSS, and the source is connected to a connecting point Na. Other configurations are same as those of the second embodiment (FIG. 2), hence same reference numbers will be appended as an alternative to their description.

Operations in the case where power supply potential VDD drops drastically from "Ve" to zero V and then recovers soon (instantaneous power interruption), after the power is turned on, the power-on reset signal PON becomes active and then later becomes inactive, will be described. In the power-on reset circuit in accordance with the fourth embodiment, when the power supply potential VDD drops drastically from "Ve" to zero V, the potential Va of the connecting point Na only drops to "–Vd" wherein pn junction voltage between the drain and the substrate of the first n-channel MOS transistor 7 is assumed as "Vd". Therefore, the power-on reset signal PON can be generated normally even during the recovery of power supply potential.

The power-on reset circuit in accordance with the fourth embodiment exerts the same effect as the power-on reset circuit in accordance with the third embodiment.

<<Fifth Embodiment>>

Figure 7:
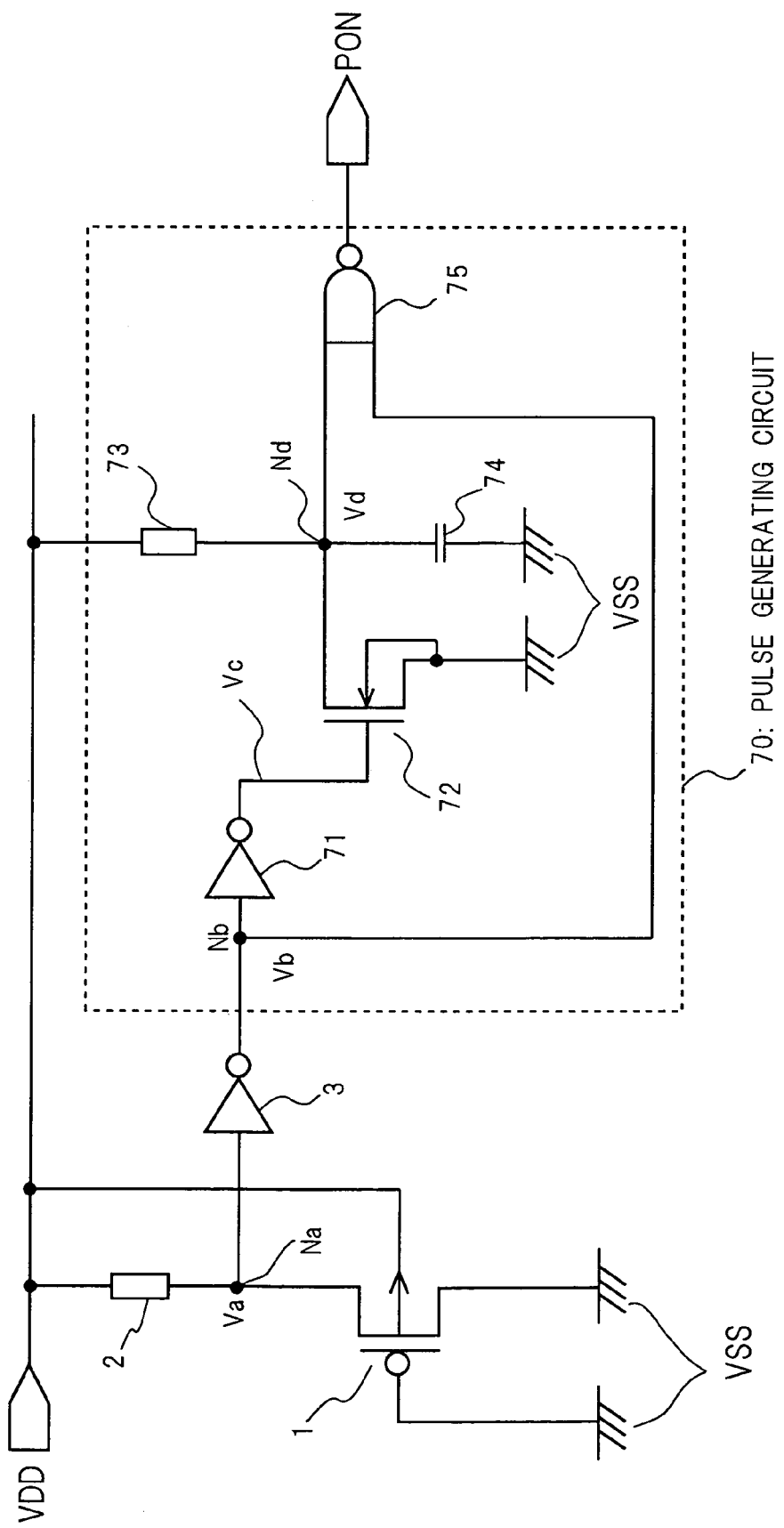
FIG. 7 is a circuit diagram of a power-on reset circuit in accordance with the fifth embodiment of the present invention.

A power-on reset circuit in accordance with the fifth embodiment of the present invention will be described with reference to FIG. 7 and FIG. 8. FIG. 7 is a circuit diagram of the power-on reset circuit in accordance with the fifth embodiment of the present invention.

The power-on reset circuit in accordance with the fifth embodiment replaces the NAND circuit 4 of the power-on reset circuit in accordance with the first embodiment (FIG. 1) with a pulse generating circuit 70. Other configurations are same as those of the first embodiment, hence same reference numbers will be appended as an alternative to their description. The pulse generating circuit 70 is comprised of a second inverter 71, a second n-channel MOS transistor 72, a second resistor 73, a capacitor 74 and a NAND circuit 75. The output terminal of the first inverter 3 is connected to the input terminal of the second inverter 71. "Nb" is a connecting point between the first inverter 3 and the second inverter 71. In the second n-channel MOS transistor 72, the gate is connected to the output terminal of the second inverter 71, the source and a substrate are connected to a ground potential VSS, and the second resistor 73 and capacitor 74 are series-connected between the power supply potential VDD and the ground potential VSS via a connecting point Nd. The drain of the second n-channel MOS transistor 72 is connected to the connecting point Nd. The two input terminals of the NAND circuit 75 are connected to the connecting point Nd and the output terminal of the first inverter 3. The output terminal of NAND circuit 75 is connected to the power-on reset signal output terminal. The output terminal of the NAND circuit 75 outputs the power-on reset signal PON.

Figure 8:
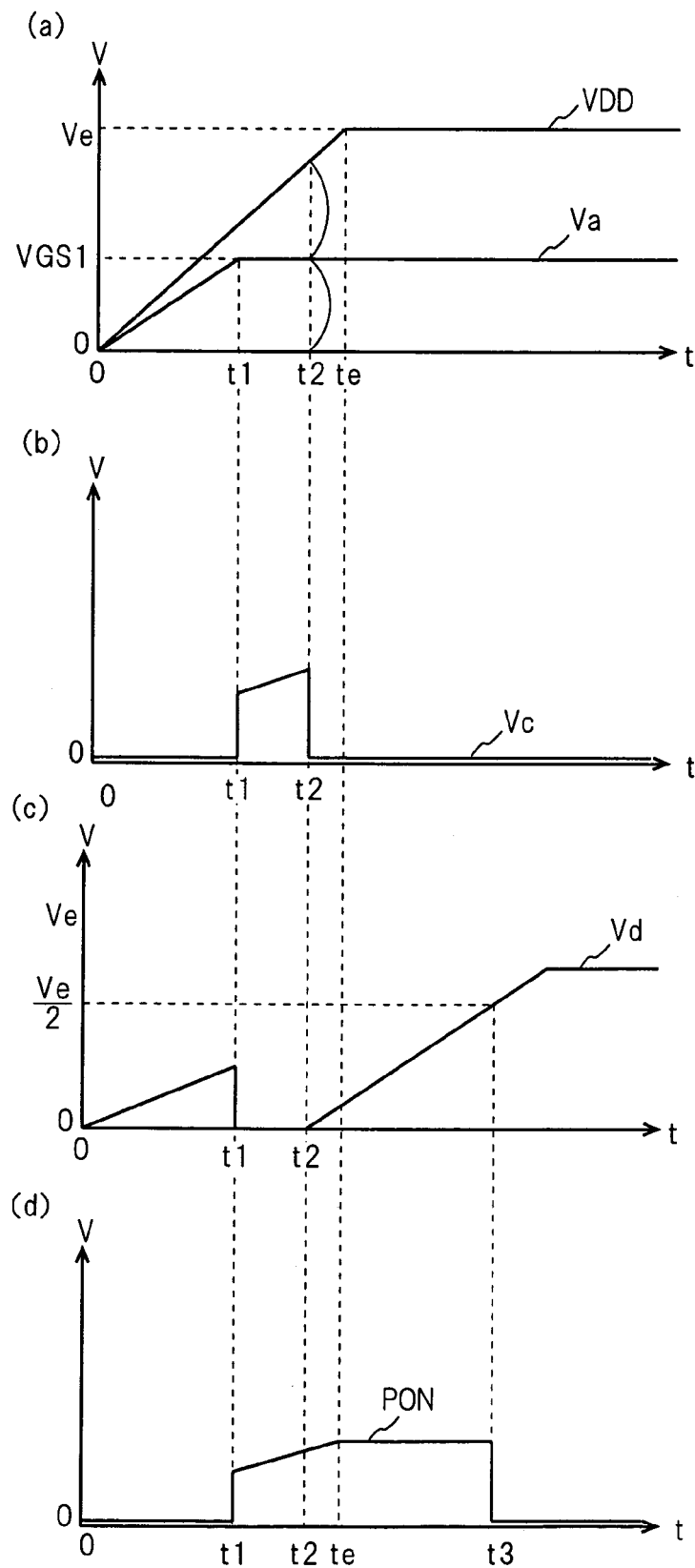
FIG. 8 is a voltage waveform chart showing the operation of a power-on reset circuit in accordance with the fifth embodiment, wherein part (a) of FIG. 8 shows waveforms of the power supply potential VDD and the potential Va of the connecting point Na, part (b) of FIG. 8 shows a waveform of the potential Vc of the output terminal of the second inverter, part (c) of FIG. 8 shows a waveform of the potential Vd of the connecting point Nd, and part (d) of FIG. 8 shows a waveform of the power-on reset signal PON.

FIG. 8 is a voltage waveform chart showing the operation of the power-on reset circuit in accordance with the fifth embodiment. In FIG. 8, part (a) shows waveforms of the power supply potential VDD and the potential Va of the connecting point Na, part (b) shows a waveform of the potential Vc of the output terminal of the second inverter 71, part (c) shows a waveform of the potential Vd of the connecting point Nd, and part (d) shows a waveform of the power-on reset signal PON.

After the power is turned on at time "0", the power supply potential VDD rises from zero and reaches the maximum value "Ve" at time "te". After the power is turned on at the time "0", the potential Va of the connecting point Na rises along with the power supply potential VDD due to microcurrent that flows through the first resistor 2. Thereby, the potential difference Va between the gate and the source of the first p-channel MOS transistor reaches the threshold voltage $V_{GS1}$ at time "t1", and the first p-channel MOS transistor is electrically conducted. The potential Va of the connecting point Na becomes a constant value thereafter (part (a) of FIG. 8).

From the power-on to the time "t1", the power supply potential VDD which is connected to an n-channel MOS transistor (not shown) or a p-channel MOS transistor (not shown) which composes the first inverter 3, the second inverter 71 and the NAND circuit 75 does not reach the threshold potential of each transistor. Therefore, the power-on reset signal PON which the NAND circuit 75 outputs becomes an L level. On the other hand, the capacitor 74 which composes the pulse generating circuit 70 is charged via the second resistor 73, and the potential Vd of the connecting point Nd rises with delay from the rising of the power supply potential VDD (part (c) of FIG. 8). Time constant until the capacitor 74 is charged will be determined from the product of the capacity of the capacitor 74 with the resistance value of second resistor 73.

From the time "t1" onward, the first inverter 3 and the pulse generating circuit 70 operate according to the logic input. The time when the power supply potential VDD reaches a twofold value (2Va) of the potential Va of the connecting point Na is assumed as time "t2". From the time "t1" to the time "t2", the output Vb of the first inverter 3 is at L level, since input voltage Va of the first inverter 3 satisfies the relational expression Va>VDD/2. Therefore, the power-on reset signal PON which is an output of the NAND circuit 75 becomes an H level (the power-on reset signal PON becomes active).

Since the potential difference Vd between the gate and the source of the second n-channel MOS transistor 72 reaches the threshold voltage in a period from the time "t1" to the time "t2", the second n-channel MOS transistor 72 is electrically conducted. During the period from the time "t1" to the time "t2", the potential Vd of the connecting point Nd is zero (part (c) of FIG. 8).

From the time "t2" onward, the output of the first inverter 3 is at H level, since the input voltage Va of the first inverter 3 satisfies the relational expression Va<VDD/2. Therefore, the output of the second inverter 71 becomes an L level (part (b) of FIG. 8), and the second n-channel MOS transistor 72 becomes an interrupted state. From the time "t2" onward, the capacitor 74 is recharged via the second resistor 73.

The time when potential Vd of the connecting point Nd reaches as high as half level of the maximum potential Ve (Ve/2) of the power supply potential VDD is assumed as time "t3". At the time "t3", the potential of one (which is connected to the connecting point Nd) of the input terminals in the NAND circuit 75 reaches the threshold potential. Therefore, the time "t3" onward, the power-on reset signal PON which is the output of the NAND circuit 75, becomes an L level (the power-on reset signal PON becomes inactive). In short, the power-on reset signal PON becomes active during a period from the time "t1" to the time "t3", and thereafter becomes inactive.

Figure 9:
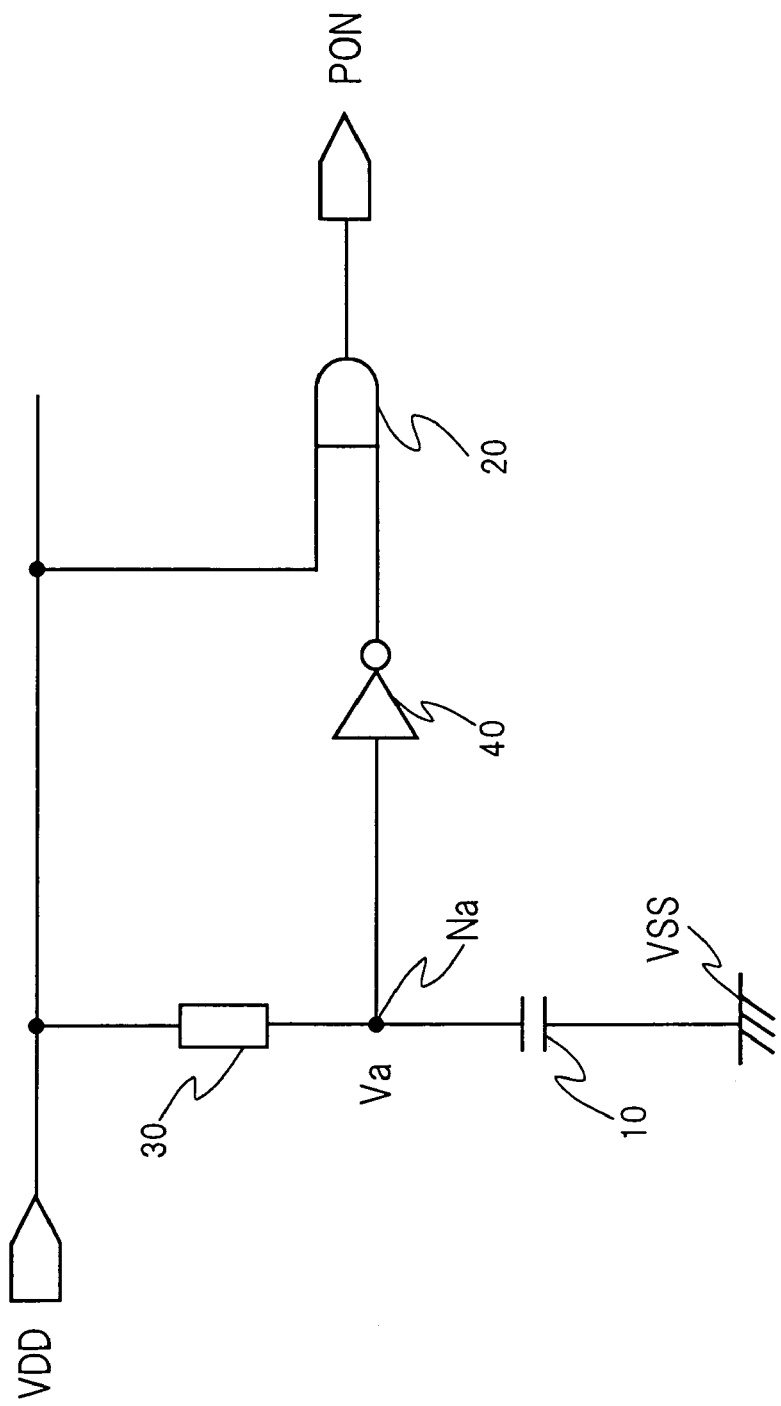
FIG. 9 is the circuit diagram of the power-on reset circuit of the conventional art.
Figure 10:
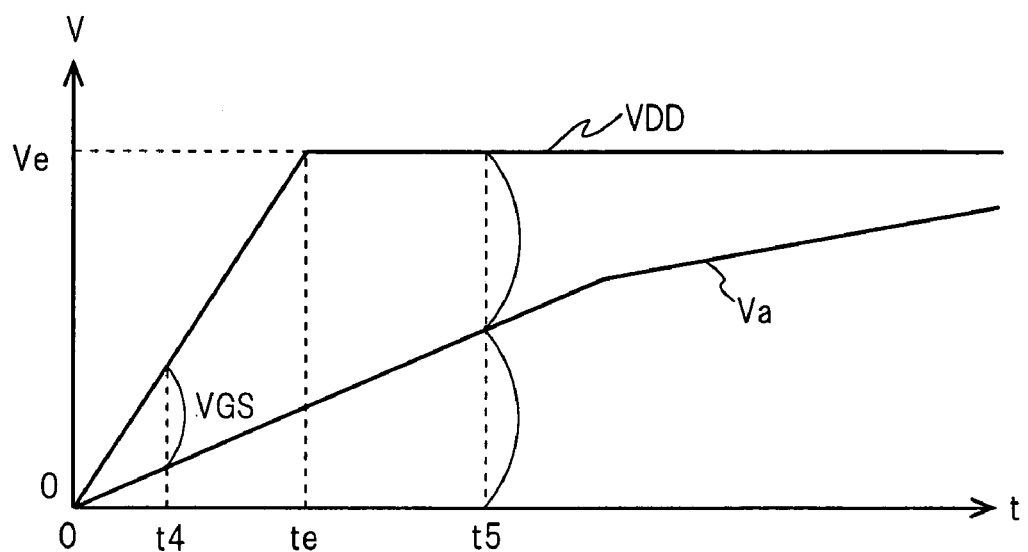
FIG. 10 is the voltage waveform chart showing the operation of the power-on reset circuit of the conventional art in the case where the power supply rises relatively abruptly, wherein part (a) of FIG. 10 shows the waveforms of the power supply potential VDD and the potential Va of the connecting point Na, part (b) of FIG. 10 shows the waveform of the power-on reset signal PON.
Figure 10:
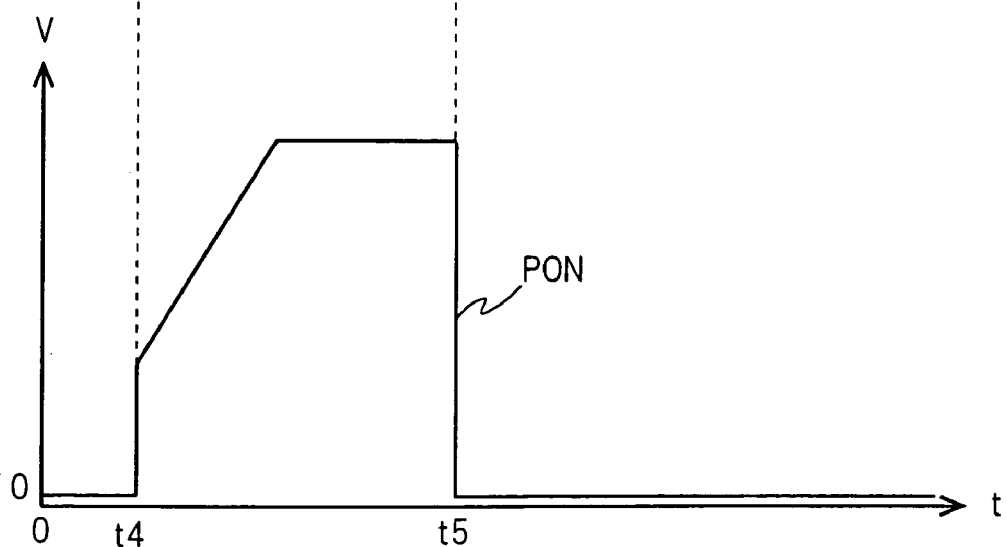
Figure 11:
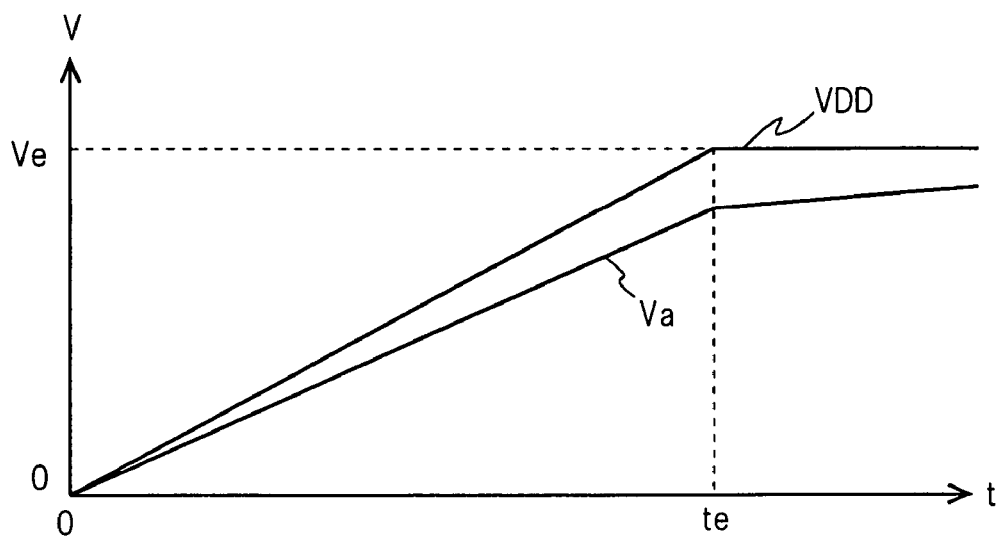
FIG. 11 is the voltage waveform chart showing the operation of the power-on reset circuit of the conventional art in the case where the power supply rises gently, wherein part (a) of FIG. 11 shows the waveforms of the power supply potential VDD and the potential Va of the connecting point Na, part (b) of FIG. 11 shows the waveform of the power-on reset signal PON.
Figure 11:
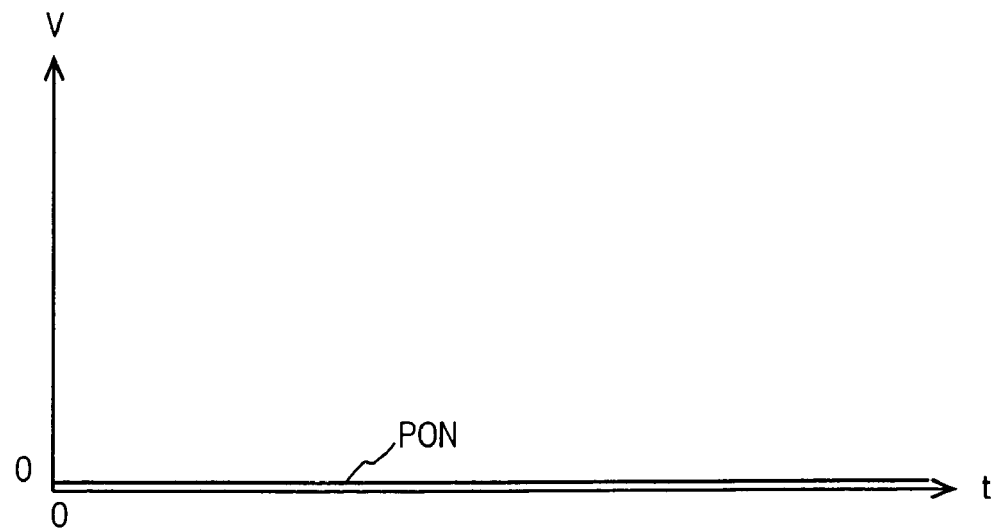

Since the power-on reset circuit in accordance with the fifth embodiment includes the capacitor 74, its circuit dimension is approximately the same as the power-on reset circuit of the conventional art (FIG. 9). However, the power-on reset circuit in accordance with the fifth embodiment operates surely by far when compared with the conventional art. By adjusting the capacity of the capacitor 74 and the resistance value of the second resistor 73, time width (the time "t3"–the time "t1") of the power-on reset signal can be set.

For example, a microcomputer generally defines the minimum time width (minimum time width after the power supply voltage reaches the rated operating voltage of the microcomputer. For example, a time equal to or more than 3-clock width of an internal clock) of the power-on reset signal at power-on. In regard to an assembly device, in effect, the microcomputer is reset in a time width period considerably longer than this minimum time width (a period in which a considerably longer time than the minimum time width elapses after power supply starts up and stabilizes).

The power-on reset circuit in accordance with the first embodiment to the fourth embodiment stops the generation of the power-on reset signal PON at time "t2" which is prior to time "te" in which the power supply completely rises. Therefore, there is a possibility in which the power-on reset signal disappears before the power supply potential VDD reaches the rate operating voltage of the microcomputer which is connected in the subsequent stage. There is a possibility in which the microcomputer will not be properly reset since the time width ("t2"–"t1") of the power-on reset signal is not wide enough. In the power-on reset circuit in accordance with the fifth embodiment, the time "t3" for stopping the power-on reset signal can be optimally set by adjusting the time constant of the pulse generating circuit. The power-on reset circuit of the present invention has an effect capable of surely resetting the external circuit that is connected to the power-on reset circuit.

Parenthetically, the pulse generating circuit 70 is not limited to the configuration shown in FIG. 7.

The present invention may have a configuration in which the NAND circuit 4 of the power-on reset circuit in accordance with the second embodiment to the fourth embodiment is replaced with the pulse generating circuit 70.

In regard to the power-on reset circuit in accordance with the first embodiment to the fourth embodiment, the NAND circuit 4 may be replaced with an inverter (connect the input terminal to the output terminal of the inverter 3). Alternatively, the power-on reset circuit may be configured so as not to use the NAND circuit 4, but to connect the output terminal of the first inverter 3 to the power-on reset signal terminal and to use the output signal of the first inverter 3 as the power-on reset signal PON (active at an L level).

The power-on reset circuit involving the present invention has an effect capable of surely generating a power-on reset signal regardless of the rise time of power supply voltage, and is useful as a power-on reset circuit which resets various digital circuits (including a microcomputer) at the startup of a power supply.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

The invention claimed is:

1. A power-on reset circuit comprising:
   a first p-channel MOS transistor having a gate, a drain, a source and a substrate, the gate and drain of said first p-channel MOS transistor being grounded, and the substrate of said first p-channel MOS transistor being connected to a power supply;
   a first resistor which is inserted and connected between said power supply and the source of said first p-channel MOS transistor;
   a first inverter having an input terminal and an output terminal, said input terminal of said first inverter being connected to the source of said first p-channel MOS transistor;
   a second p-channel MOS transistor having a gate, a drain, a source and a substrate, the gate of said second p-channel MOS transistor being connected to said power supply, the drain of said second p-channel MOS transistor being grounded, and the source and substrate of said second p-channel MOS transistor being connected to said input terminal of said first inverter; and
   a power-on reset signal output terminal for outputting a power-on reset signal, said power-on reset signal output terminal being connected to said output terminal of said first inverter.

2. A power-on reset circuit comprising:
   a first p-channel MOS transistor having a gate, a drain, a source and a substrate, the gate and drain of said first p-channel MOS transistor being grounded, and the substrate of said first p-channel MOS transistor being connected to a power supply;
   a second p-channel MOS transistor having a gate, a drain, a source and a substrate, the gate, source and substrate of said second p-channel MOS transistor being connected to said power supply, and the drain of said second p-channel MOS transistor being connected to the source of said first p-channel MOS transistor;
   a first inverter having an input terminal and an output terminal, said input terminal of said first inverter being connected to the source of said first p-channel MOS transistor;
   a third p-channel MOS transistor having a gate, a drain, a source and a substrate, the gate of said third p-channel MOS transistor being connected to said power supply, the drain of said third p-channel MOS transistor being grounded, and the source and substrate of said third p-channel MOS transistor being connected to said input terminal of said first inverter; and
   a power-on reset signal output terminal for outputting a power-on reset signal, said power-on reset signal output terminal being connected to said output terminal of said first inverter.

3. The power-on reset circuit in accordance with claim 1, further comprising a pulse generating circuit being inserted between said output terminal of said first inverter and said power-on reset signal output terminal,
   wherein said pulse generating circuit stops the power-on reset signal after an electric potential of said power supply rises to a maximum value.

4. The power-on reset circuit in accordance with claim 2, further comprising a pulse generating circuit being inserted between said output terminal of said first inverter and said power-on reset signal output terminal,
   wherein said pulse generating circuit stops the power-on reset signal after an electric potential of said power supply rises to a maximum value.

5. The power-on reset circuit in accordance with claim 3, wherein said pulse generating circuit comprises:
   a second inverter having an input terminal and an output terminal, said input terminal of said second inverter being connected to said output terminal of said first inverter;
   an n-channel MOS transistor having a gate, a drain, a source and a substrate, the gate of said n-channel MOS transistor being connected to said output terminal of said second inverter, and the source of substrate of said n-channel MOS transistor being grounded;
   a capacitor being connected between the drain of said n-channel MOS transistor and a ground potential;
   a second resistor being connected between said power supply and the drain of said n-channel MOS transistor; and
   a NAND circuit having two input terminals and an output terminal, said two input terminals of said NAND circuit being connected to the drain of said n-channel MOS transistor and said output terminal of said first inverter, respectfully, and said output terminal of said NAND circuit being connected to said power-on reset signal output terminal.

6. The power-on reset circuit in accordance with claim 4, wherein said pulse generating circuit comprises:
   a second inverter having an input terminal and an output terminal, said input terminal of said second inverter being connected to said output terminal of said first inverter;
   an n-channel MOS transistor having a gate, a drain, a source and a substrate, the gate of said n-channel MOS transistor being connected to said output terminal of said second inverter, and the source of substrate of said n-channel MOS transistor being grounded;

a capacitor being connected between the drain of said n-channel MOS transistor and a ground potential;

a first resistor being connected between said power supply and the drain of said n-channel MOS transistor; and a NAND circuit having two input terminals and an output terminal, said two input terminals of said NAND circuit being connected to the drain of said n-channel MOS transistor and said output terminal of said first inverter, respectively, and said output terminal of said NAND circuit being connected to said power-on reset signal output terminal.

7. The power-on reset circuit in accordance with claim 1, further comprising a NAND circuit which is inserted between the output terminal of said first inverter and said power-on reset signal output terminal, having two input terminals and an output terminal, wherein the two input terminals of said NAND circuit are connected to said power supply and the output terminal of said first inverter, respectively, and the output terminal of said NAND circuit is connected to said power-on reset signal output terminal.

8. The power-on reset circuit in accordance with claim 2, further comprising a NAND circuit which is inserted between the output terminal of said first inverter and said power-on reset signal output terminal, having two input terminals and an output terminal, wherein the two input terminals of said NAND circuit are connected to said power supply and the output terminal of said first inverter, respectively, and the output terminal of said NAND circuit is connected to said power-on reset signal output terminal.

* * * * *

UNITED STATES PATENT AND TRADEMARK OFFICE
CERTIFICATE OF CORRECTION

PATENT NO. : 7,262,646 B2
APPLICATION NO. : 10/891230
DATED : August 28, 2007
INVENTOR(S) : Norihide Kinugasa et al.

It is certified that error appears in the above-identified patent and that said Letters Patent is hereby corrected as shown below:

On the title page of the Letters Patent,

Under section (56) References Cited, FOREIGN PATENT DOCUMENTS, add, -- JP 2-154520 A 6/1990 --

Signed and Sealed this

First Day of April, 2008

JON W. DUDAS
*Director of the United States Patent and Trademark Office*